United States Patent [19]

Rogers

[11] 4,147,985

[45] Apr. 3, 1979

[54] LOW LEVEL MODULATION SYSTEM FOR A RADIO TRANSMITTER

[76] Inventor: Noel A. Rogers, 9121 W. 70th St., Shawnee Mission, Kans. 66204

[21] Appl. No.: 820,209

[22] Filed: Jul. 29, 1977

[51] Int. Cl.² .............................................. H04B 1/04
[52] U.S. Cl. .................................. 325/144; 325/159; 325/152; 332/37 D
[58] Field of Search ............... 325/144, 145, 158, 152, 325/182, 184, 185, 187, 159; 332/18, 19, 37 D, 38, 40, 42

[56] References Cited

U.S. PATENT DOCUMENTS

| 2,243,221 | 5/1941 | Quilter | 325/144 |
|---|---|---|---|
| 3,422,356 | 1/1969 | Fritts | 325/159 |
| 3,891,926 | 6/1975 | Ishman et al. | 325/159 |
| 3,961,287 | 6/1976 | Cacciola et al. | 332/37 D |

Primary Examiner—Robert L. Griffin
Assistant Examiner—Tommy P. Chin
Attorney, Agent, or Firm—Schmidt, Johnson, Hovey & Williams

[57] ABSTRACT

A low level modulation circuit for use in a radio transmitter obviates the needs for an audio transformer device heretofore required for high signal level modulation of the final stages of a multistage radio frequency amplifier by modulating an initial amplifier stage using a conditioned, low level modulation signal, but yet eliminates additional distortion and noise imposed upon the modulated audio signal by the initial and intermediate amplification stages, through the use of a single, negative feedback circuit. The feedback circuit novelly employs a directional wave coupling device and envelope detection circuitry for deriving signal information from the modulated radio frequency carrier wave just prior to radio transmission of the latter, and functions to combine the derived signal information with the output of a modulating signal source in order to produce a conditioned, low level modulating signal input to the initial amplification stage which modulates the transmitter in a manner to maintain the radio frequency power output of the transmitter at a nearly constant level in spite of variations in supply voltage or amplifier gain, while also reducing noise and distortion in the modulating portion of the transmitted radio output wave. The effects of reflected waves on the antenna line are also sensed by the feedback circuit which uses a shunting diode to drain energy from the initial radio frequency amplification stage and prevent overdriving or burnout of the radio frequency amplifier in the event that abnormally high reflected waves are sensed.

2 Claims, 1 Drawing Figure

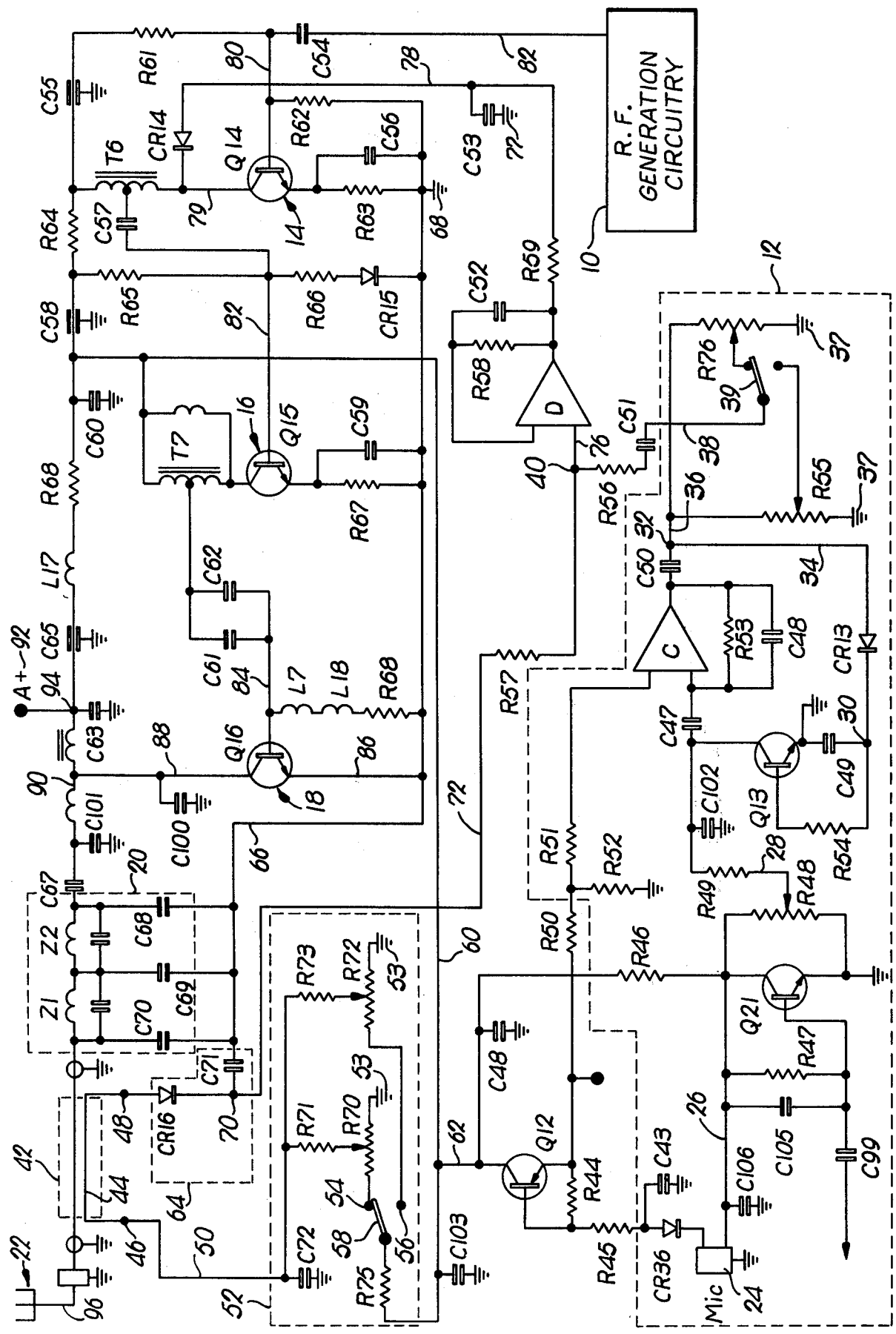

LOW LEVEL MODULATION SYSTEM FOR A RADIO TRANSMITTER

BACKGROUND AND BRIEF DESCRIPTION OF THE INVENTION

This invention pertains to RF (radio frequency) transmission circuitry and deals more particularly with the use of a unique feedback circuit to permit low level modulation of an ordinary radio transmitter.

Unwanted variation in modulation and power output levels in radio transmitters prompted by variations in supply voltage, amplifier gain and distortion has been a long-standing problem in the art. Also, in the past, in order to achieve the desired signal transmission range, it was sometimes necessary to approach one hundred percent modulation of the transmitter; however, this mode of operation is generally undesirable since distortion is usually increased and occasional over-modulation caused by such distortion results in the transmitted signal being "splattered" over from the allocated band to other broadcasting bands in violation of federal regulatory standards. Consequently, modulation levels lower than one hundred percent must generally be used to avoid splattering; however, prior art modulation circuit designs share the common disadvantage that the radiated power associated with the up-peak of the modulated wave is generally less than the power associated with the down-peak thereof when operating at less than 100 percent modulation. This imbalance between up- and-down peaks of the modulated wave reduces the effective transmission range of the transmitter. A still further problem to be dealt with in the design of radio transmitter circuits is the tendency of the RF amplifier to self-oscillate, overdrive itself, or even burnout when abnormally high waves are reflected back from the antenna toward the transmitter.

The use of feedback circuits in the first stages of a radio transmitter and particularly AM (amplitude modulation) transmitters, for controlling the level of RF power output is an art recognized concept. For example, U.S. Pat. No. 3,808,539 to Martin, discloses a feedback circuit loop connecting selected stages of an RF amplifier for providing a direct current feedback voltage to an earlier stage, when the RF output power of the amplifier diminishes as a result of battery drain or the like, in order to increase the gain of the earlier stage and therby maintain the RF power output of the transmitter more nearly constant. The feedback circuit disclosed by Martin however, in no way controls modulation as contemplated by the present invention. U.S. Pat. No. 2,085,125 to Shaw, teaches the use of a pair of feedback circuits coupled between a receiver for monitoring the transmitted radio waves, and the audio and RF stages respectively of the transmitter. The approach by Shaw requires the use of a separate receiving means including a reception antenna physically spaced from the transmitting antenna, and is therefore impractical for use by a mobile transmitter such as a hand-held transceiver. Moreover, neither of the feedback circuits of Shaw are employed to achieve low level modulation of the transmitter. In any event, none of the circuits taught by these prior art patents is operable to compensate for the effects of abnormally high levels of reflected waves which may exist on the antenna line.

The present invention overcomes deficiencies inherent in prior art designs by providing especially simple feedback circuit means integral with the transmitter which not only maintains a constant level of RF output power, but compensates for the effects of waves reflected on the antenna line, reduces noise and distortion in the modulating portion of the transmitted radio wave, and provides modulation of the transmitter using low level modulation signals and a single feedback loop. According to the present invention, a single feedback circuit coupled between the initial stage of a multistage type RF amplifier and the transmitter antenna line includes a directional coupling device and envelope detection circuitry for deriving signal information from the modulated carrier wave just prior to transmission of the latter. The signal information is combined with the output of a modulating signal source to form a conditioned, low level modulation signal which is processed by an operational amplifier and is delivered through a shunting diode to the collector of the initial stage of a multistage, transistorized RF amplifier. The shunting diode is responsive to the composite waveform characteristics of the conditioned modulating signal to selectively drain RF energy from the initial amplifier stage in order to maintain the amplifier output level nearly constant and to protect against overdriving of the amplifier in the event that high levels of reflected waves are present on the antenna line. One or more potentiometers is coupled between the feedback circuit and a direct current voltage source to conveniently set the quiescent operating point of the feedback circuit, which in turn predetermines the RF output level and modulation percentage of the transmitter.

The primary object of the invention is to provide a unique method of, and circuit means for, low level signal modulation of a radio frequency transmitter.

Another object of the invention is to provide unique circuit means for maintaining the power output of a radio frequency transmitter at a relatively constant level in spite of variations in power supply level, degradation of electrical components over time, amplifier distortion, changes in amplifier gain, and reflected waves present on the antenna line.

A further object of the invention is to provide unique circuit means of the type described which yields full up-peak modulation of a carrier wave in a radio frequency transmitter even in the presence of voltage standing waves on the antenna line, thereby increasing the power output and transmission range of the transmitter.

Still another object of the invention is to provide a unique method of, and circuit means for, amplitude modulation of a radio frequency carrier wave without the need for an audio frequency transformer device. As a corollary to the foregoing object, it is a further aim of the invention to modulate an early stage of a multistage RF amplifier using a low level modulation signal.

Another object of the invention is to provide a unique means for extracting a modulated RF carrier signal, prior to transmission of the latter, for purposes of feeding back certain information components of the modulated wave in a feedback circuit in order to control RF power output, audio distortion and modulation percentage of a radio transmitter.

A further object of the invention is to provide an especially simple means for adjusting the RF power output of a radio transmitter using a single potentiometer device.

Other and further objects of the invention will be made clear or become apparent in the course of the following description.

THE DRAWING

The accompanying drawing, which forms a part of the specification and is to be read in conjunction therewith, is a combined block and schematic circuit diagram of a low level modulation system for a radio transmitter, which forms the preferred embodiment of the invention.

DETAILED DESCRIPTION OF THE INVENTION

With reference to the drawing, a broadband AM radio transmitter suitable for use in a radio transceiver, broadly comprises the usual functional sections including: RF generation circuitry 10 for producing an RF carrier wave; audio input and compression circuitry indicated within the broken line 12; RF predrive amplifier 14, RF driver amplifier 16; RF final amplifier 18; low pass filter shown within the broken line 20; and transmission antenna 22. Those skilled in the art will appreciate that the RF generation circuitry 10 may be constructed in a number of known ways, and although not specifically shown in the drawing, the circuitry 10 will typically include a sidestep oscillator, channel selecting circuitry, a mixer, and an exciter filter.

The audio input and compression circuitry 12 includes and audio input such as a microphone 24 which delivers audio frequency signals on line 26 to potentiometer R48 to allow adjustment of the microphone input gain. The audio signal level picked off from potentiometer R48 on line 28 is delivered through resistor R49 and is capacitively coupled by capacitor C47 to the noninverting input terminal of the operational amplifier denoted by the letter C. A clamp transistor Q13 has the collector thereof also capacitively coupled through capacitor C47 to the noninverting input of operational amplifier C, while the base and emitter of the transistor Q13 are commonly connected at junction 30 through resistor R54 and capacitor C49 respectively, to the cathode of diode CR13. Operational amplifier C has resistor R53 and capacitor C48 coupled in parallel with each other in the feedback circuit thereof, and has the output terminal thereof capacitively coupled via capacitor C50 to circuit junction 32, a second connection to the junction 32 being formed by line 34 which in turn is connected to the anode of diode CR13. The circuit junction 32 is connected by line 36 to one fixed terminal of the respective modulation potentiometers R55 and R76, the other fixed terminal of each thereof being connected to the ground 37. Switch 39 is provided to permit junction 32 to be selectively connected with the variable terminal of either potentiometer R55 or R76. The adjustable audio output signal from potentiometer R55 (or R76) is coupled from line 38 through capacitor C51 and is delivered via scaling resistor R56 to summing junction 40.

A conventional directional coupler 42 of the bidirectional receiving type, is operably coupled between the transmission antenna 22 and low-pass filter 20. Directional coupler 42 may be constructed in a number of known manners including conventional stripline circuit techniques and typically will include a pick-off line 44 having a pair of output terminals 46 and 48 respectively. Output terminal 46 is connected via line 50 to the output of the adjustable power output level control section shown within the broken line 52. Control section 52 includes resistors R71 and R73 which are commonly coupled by capacitor C72 to ground and form inputs to the variable terminals of potentiometers R70 and R72 respectively. One side of both potentiometers R70 and R72 are coupled to the ground 53 while the other sides thereof are connected to terminals 54 and 56 respectively of manually operable switch 58. Switch 58 is connected via resistor R75 to the previously mentioned RF amplification stages on line 60 as well as to the audio input and compression circuitry 12 by line 62.

Output terminal 48 of directional coupler 42 is connected to the anode of diode CR16 which forms, in combination with capacitor C71, the linear envelope detector 64. The cathode of diode CR16 is connected to one side of capacitor C71, the other side of capacitor C71 being connected via line 66 to the ground 68. The cathode of diode CR16 is also connected by junction 70 and line 72 through scaling resistor R57 to form a second circuit connection to the summing junction 40. Summing junction 40 is operably connected via line 76 to the non-inverting input of an operational amplifier designated by the letter D. Operational amplifier D has a feedback loop connected between its output terminal and the inverting input terminal thereof, which loop comprises resistor R58 and capacitor C52 coupled in electrical parallel relationship to each other. The output of operational amplifier D is delivered through resistor R59 to the ground 77 via capacitor C53, and also via line 78 to the anode of modulating diode CR14, the cathode of diode CR14 being connected by line 79 to the collector of the transistor Q14. Transistor Q14 has the base thereof operably coupled via line 80 through capacitor C54 and line 82 to the RF generation circuitry 10, while the emitter of transistor Q14 is connected to ground 68 through resistor R63 and capacitor C56.

The predriver amplifier 14, driver amplifier 16 and final amplifier 18, form in combination, a conventional broadband class C amplifier, wherein the respective transistors Q14, Q15 and Q16 are operably interconnected in the common emitter configuration. The output signal from the collector of transistor Q14 is delivered via line 78 through RF transformer T6, and capacitor C57, thence on line 82 to the base of transistor Q15. Transistor Q15 has the emitter thereof connected to the ground 68 through resistor R67 and capacitor C59. The output signal from the collector of transistor Q15 is delivered through RF transformer T7, thence through capacitors C61 and C62 on line 84 to the base of transistor Q16, the emitter of transistor Q16 being connected to ground 68 via line 86, while the base thereof is also connected to ground 68 through inductors L7 and L18 as well as the resistor R68. The collector of transistor Q16 is operably coupled by lines 88 and 90 through capacitor C67 to the input of the low-pass filter 20. Low-pass filter 20 is of conventional design and includes impedances Z1 and Z2, as well as the capacitors C68, C69 and C70, the latter each having one side thereof connected to the ground 68. A source of primary voltage 92 is operably connected to the circuitry at connection 94.

In operation, modulating audio signals are derived from a transducer such as microphone 24 and amplified by the transistor Q21, the resulting gain being manually adjustable by potentiometer R48. The amplified modulating signal on line 28 is then delivered to the non-inverting input of operational amplifier C, which amplifier in combination with the diode CR13, capacitor C49, resistor R54 and clamp transistor Q13, provides audio compression to prevent over-modulating the transmitter on voice peaks. Modulation potentiometers R55 and R76 function to selectively set the level of audio modulation which is delivered via lines 38 and 76 through operational amplifier D to the modulation diode CR14. The level of the modulating audio signal delivered to diode CR14 is also controlled by a unique negative feedback circuit which comprises an important part of the present invention. This negative feedback circuit can be traced from the output of the transmitter to the input section of the previously discussed RF amplification stages, and includes directional coupler 42, linear envelope detector 64, line 72, summing junction 40, operational amplifier D, capacitor C53, and modulating diode CR14. The operation of the negative feedback circuit may best be understood by tracing the path of the feedback signal which is initially picked off by the directional coupler 42 and delivered to the output terminal 48. The complex signal appearing at output terminal 48 is essentially identical in character to the signal being delivered to the transmitting antenna 22, and comprises an audio modulated radio frequency signal. As will become readily apparent hereinafter, the direct current component of the modulated signal will be employed to control in part, the level of RF output power from the transmitter, and the alternating current component inherent in the modulated signal will be employed to control the percent of modulation of the RF carrier wave.

The composite modulated signal at output terminal 48 is delivered to the detector diode CR16 which operates to envelope rectify the RF carrier wave. Capacitor C71 filters out the radio frequency component of the rectified, modulated signal, thereby allowing a varying D.C. (direct current) signal which comprises the aforementioned direct current and alternating current components, to be delivered via line 72 through scaling resistor R57, to summing junction 40.

The varying D.C. signal derived from the directional coupler 42 and the modulating audio signal produced by the audio input and compression circuitry 12 are then algebraically combined or "summed" at the summing junction 40, the resulting composite modulated signal on line 76 being delivered to the non-inverting input of operational amplifier D. Operational amplifier D functions to amplify the resultant modulating signal, the D.C. gain of such amplifier being determined by the value of resistor R58. The amount of gain provided by operational amplifier D determines the range within which the feedback circuit will function to control varying circuit conditions which affect the degree of modulation and power output of the transmitter. Capacitor C52, as discussed later in more detail, is provided to roll-off signal frequencies above approximately 2,600 Hertz to assure stability of overall circuit operation.

The resultant output signal from operational amplifier D functions to set the D.C. voltage level applied to the anode of modulation diode CR14, which diode controls the RF voltage level on the collector of transistor Q14. When the output voltage of operational amplifier D is high, i.e. when the D.C. voltage is at a relative maximum peak corresponding to maximum RF power output of the transmitter, diode CR14 becomes conductive, thus allowing RF energy which is present at the collector of transistor Q14 to flow through lines 79 and 78 to the ground through capacitor C53. Conversely, when the output voltage of operational amplifier D swings low to a relative minimum, diode CR14 is turned off (non-conducting), and maximum RF power is transferred from predriver amplifier 14 to subsequent amplifier stages 16 and 18 respectively, thus producing maximum RF output power from the transmitter. Modulating diode CR14 and grounded capacitor C53 thus form in combination, a regulator circuit which regulates the RF energy output of the predriver amplifier 14.

It can be appreciated at this point, that since the modulation diode CR14 is controlled by a signal having a waveform which includes components of both the modulated RF signal being transmitted and the modulating audio signal, a single feedback circuit is uniquely employed to eliminate audio noise and distortion, as well as to control transmitter modulation and RF power output to a nearly constant level. Moreover, this unique circuit arrangement is also responsive to open and short circuits on the antenna line 96 and high levels of reflected waves thereon, for protecting the transmitter against self-oscillation and potential burn-out since any of these adverse conditions would result in the modulation diode CR14 operating to conduct and thereby shunting RF energy at the collector of transistor Q14 to maintain a safe operating point for final transistor Q16. It is to be further recognized that, in contrast to prior art circuit designs, the initial stage of the multistage RF amplifier is being modulated, using a relative low level modulating signal, without the need for an audio transformer to provide high level modulation signals.

It now remains to discuss the means by which the quiescent power output level of the transmitter may be set, and therefore the voltage level at which modulation diode CR14 conducts to control the gain of the RF predriver amplifier 14. The RF power output level delivered to the antenna 22 is controlled in part by a D.C. voltage derived from the RF amplification stages on line 60 and delivered to the inputs of adjustable power output level control section 52, and more particularly to the switch 58. The manually operable switch 58 is employed to selectively connect the D.C. voltage received on line 60 to one of the respective potentiometers R70 and R72 through the terminals 54 and 56. By using differing component values for the scaling resistors R71 and R73, the resulting biasing voltage that is delivered to the pick-off line 44 by line 50 may comprise either of two voltage levels, which levels are selectable by the user by positioning the switch 58 to the desired position either in contact with terminal 54 or terminal 56. The potentiometers R70 and R72 function to allow the precise adjustment of the respective biasing voltage levels passed therethrough. Although a pair of potentiometers R70 and R72 and corresponding scaling resistors R71 and R73 are disclosed in the preferred embodiment discussed herein, it is understood that a single scaling resistor may be employed in lieu of the multiple combinations of scaling resistors and potentiometers, to satisfactorily provide the needed biasing voltage. In any event, the biasing voltage delivered on line 50 to the directional coupler 42 is impressed on the waveform signal derived from the modulated RF wave being transmitted on line 96, and in effect, raises the DC level of the derived waveform signal in proportion to the biasing voltage. As a result, the biasing voltage is also impressed throughout the feedback circuit loop and functions, in part, to determine the threshold point at which modulating diode CR14 becomes conductive.

Operating stability of the feedback circuit is particularly important in the present invention and is assured by providing audio roll-off in the upper and lower frequency ranges, to leave a range of intermediate frequencies within which circuit operation is highly stable. The use of capacitors C47, C50 and C51 with component values appropriate to the intended application, provide frequency roll-off and limit modulation response at frequencies below approximately 400 Hertz, while the use of capacitors C48, C102, C52 and C53 with appropriate component values, provide frequency roll-off and limit modulation response above approximately 2,600 Hertz.

It may be observed that the low level modulation system not only provides for the reliable accomplishment of the object of the invention, but does so in an especially simple and reliable manner. It is recognized, of course, that those skilled in the art may make various modifications or additions to the preferred embodiment chosen to illustrate the invention without departing from the gist and essence of the present contribution to the art. Accordingly, it is to be understood that the protection sought and to be afforded hereby should be deemed to extend to the subject matter claimed and all equivalents thereof fairly within the scope of the invention.

I claim:

1. In a radio transmitter:

means for producing a radio frequency carrier wave;

means for producing a modulation signal to modulate said carrier wave, and having an output terminal;

amplification means for amplifying the power of said modulated carrier wave, said amplification means having an input section operably coupled with said carrier wave producing means and said modulation producing means, and having an output section;

means adapted to be operably coupled between an antenna associated with said transmitter and said output section, for receiving an amplified, modulated carrier wave prior to transmission of the latter; and feedback circuit means coupled between said receiving means and said input section for operating on said received wave and for controlling said amplification means responsive thereto, said output terminal of said modulation producing means being operably coupled with said feedback circuit means for delivering said modulation signal to said input section through said feedback circuit means, said feedback circuit means including detection means operably coupled with said receiving means for extracting signal information from said wave received by said receiving means, amplifier means having an input terminal thereof operably coupled with said detection means for conditioning said signal information received from said detection means, said amplifier means having an output terminal for delivering a conditioned signal, and regulating circuit means operably coupled between said input section and said output terminal of said amplifying means and responsive to said conditioned signal for controlling said amplification means, said receiving means including a pair of output terminals, one of said output terminals of said receiving means being operably coupled with said detection device, there being further means provided for selectively adjusting the quiescent operating point of said amplifier means, including first and second resistive elements each having an output terminal and an input terminal thereof operably connected with the other output terminal of said receiving, means and manually operable switch means for selectively coupling the output terminal of one of said elements with an electrical voltage source.

2. The invention of claim 1, wherein each of said resistive elements comprises a potentiometer device.

* * * * *